United States Patent
Lee et al.

(10) Patent No.: US 6,775,138 B2
(45) Date of Patent: Aug. 10, 2004

(54) HEAT SINK CLIP WITH PLURALITY OF PRESSING PORTIONS

(75) Inventors: Hsieh Kun Lee, Tu-chen (TW); Wellint Xia, Shenzhen (CN); Toly Lee, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/315,688

(22) Filed: Dec. 9, 2002

(65) Prior Publication Data

US 2004/0066626 A1 Apr. 8, 2004

(30) Foreign Application Priority Data

Oct. 4, 2002 (TW) ...................................... 91215778 U

(51) Int. Cl.[7] .......................... H05K 7/20; H01L 23/40
(52) U.S. Cl. ...................... 361/697; 361/696; 361/702; 361/703; 257/706; 257/707; 24/458
(58) Field of Search ................................. 361/702–705, 361/706–712, 717–719, 722, 696, 697; 24/297, 453, 457, 458, 625; 248/510; 174/16.3; 165/80.3, 185; 257/705, 706, 707, 713, 717–719

(56) References Cited

U.S. PATENT DOCUMENTS

| | | | | |
|---|---|---|---|---|
| 4,716,494 A | * | 12/1987 | Bright et al. | 361/704 |
| 5,448,449 A | * | 9/1995 | Bright et al. | 361/704 |
| 5,771,155 A | * | 6/1998 | Cook | 361/710 |
| 6,424,530 B1 | * | 7/2002 | Lee et al. | 361/704 |
| 6,518,507 B1 | * | 2/2003 | Chen | 174/252 |

* cited by examiner

Primary Examiner—Anatoly Vortman
(74) Attorney, Agent, or Firm—Wei Te Chung

(57) ABSTRACT

A heat sink clip (10) is shaped from a single piece of metal wire. Opposite ends of the metal wire are bent to form a generally twin strand structure that is the clip. The clip includes a central pressing portion (12), two resilient connecting portions (18) extending outwardly and upwardly from the pressing portion, and two arms (14) depending from distal ends of the connecting portions. The pressing portion has four contact points at a bottom thereof, for pressing a heat sink (20) onto a CPU (30). A pair of hooks (16, 16') is inwardly formed from distal ends of the arms respectively, for engaging with a pair of retaining ears (42) at opposite sides of a CPU socket (40). The contact points of the pressing portion enable the heat sink to be securely fastened to the CPU mounted on the CPU socket.

15 Claims, 3 Drawing Sheets

HEAT SINK CLIP WITH PLURALITY OF PRESSING PORTIONS

BACKGROUND OF THE INVENTION

1. Field of the Invention

The present invention relates to heat sink clips, and more particularly to a heat sink clip which easily and securely attaches a heat sink to an electronic device such as a central processing unit (CPU) that is mounted on a socket.

2. Description of Prior Art

Continued development of CPUs has enabled them to perform more and more functions. Heat generated by CPUs has increased commensurately. Measures must be taken to efficiently remove the heat from the CPU. Typically, a heat sink having great heat conductivity is mounted on the CPU to remove heat therefrom. A clip is frequently used to firmly attach the heat sink to the CPU, thus achieving greater efficiency of heat dissipation.

A conventional clip for securing a heat sink, a CPU and a CPU socket together is disclosed in U.S. Pat. No. 5,771,155. Referring to FIG. 3, the clip comprises a horizontal portion 514, a first leg 588, a second leg 594, and a handle 592. A coiled pressing portion 552 is formed in a middle part of the horizontal portion 514, for pressing a heat sink 400 against a CPU 600. A pair of looped hooks 590 is respectively formed at distal ends of the first and second legs 588, 594. The hooks 590 are resiliently engaged with ears 710 formed at opposite sides of a CPU socket 700. However, the pressing portion 552 provides only two contact points pressing against the heat sink 400. The clip does not apply enough force to securely retain the heat sink 400 against the CPU 600, particularly when the assembly is subjected to vibration or shock during use.

Thus, a heat sink clip which can overcome the above-mentioned problems is desired.

SUMMARY OF THE INVENTION

Accordingly, an object of the present invention is to provide a heat sink clip which easily and securely attaches a heat sink to an electronic device such as a CPU that is mounted on a socket.

In order to achieve the object set out above, a heat sink clip in accordance with a preferred embodiment of the present invention is for securing a heat sink to a CPU mounted on a CPU socket. The clip is shaped from a single piece of metal wire. Opposite ends of the metal wire are bent to form a generally twin strand structure that is the clip. The clip comprises a central pressing portion, two resilient connecting portions extending outwardly and upwardly from the pressing portion, and two arms depending from distal ends of the connecting portions. The pressing portion comprises four contact points at a bottom thereof, for pressing the heat sink onto the CPU. A pair of hooks is inwardly formed from distal ends of the arms respectively, for engaging with a pair of retaining ears at opposite sides of the CPU socket. The contact points of the pressing portion enable the heat sink to be securely fastened to the CPU on the CPU socket.

Other objects, advantages and novel features of the present invention will become more apparent from the following detailed description when taken in conjunction with the accompanying drawings, in which:

DETAILED DESCRIPTION OF THE PREFERRED EMBODIMENT

Figure 1:
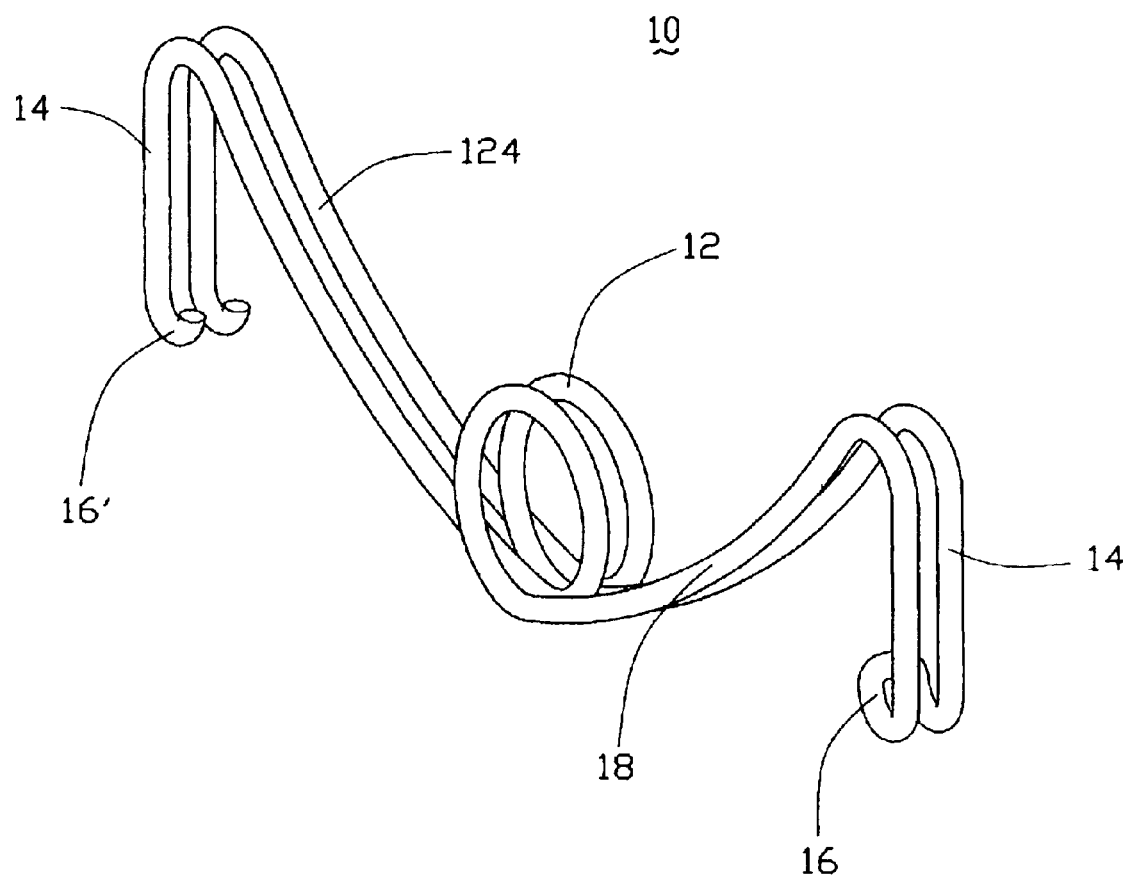
FIG. 1 is an isometric view of a heat sink clip in accordance with the preferred embodiment of the present invention.

Reference will now be made to the drawing figures to describe the preferred embodiment of the present invention in detail.

Figure 2:
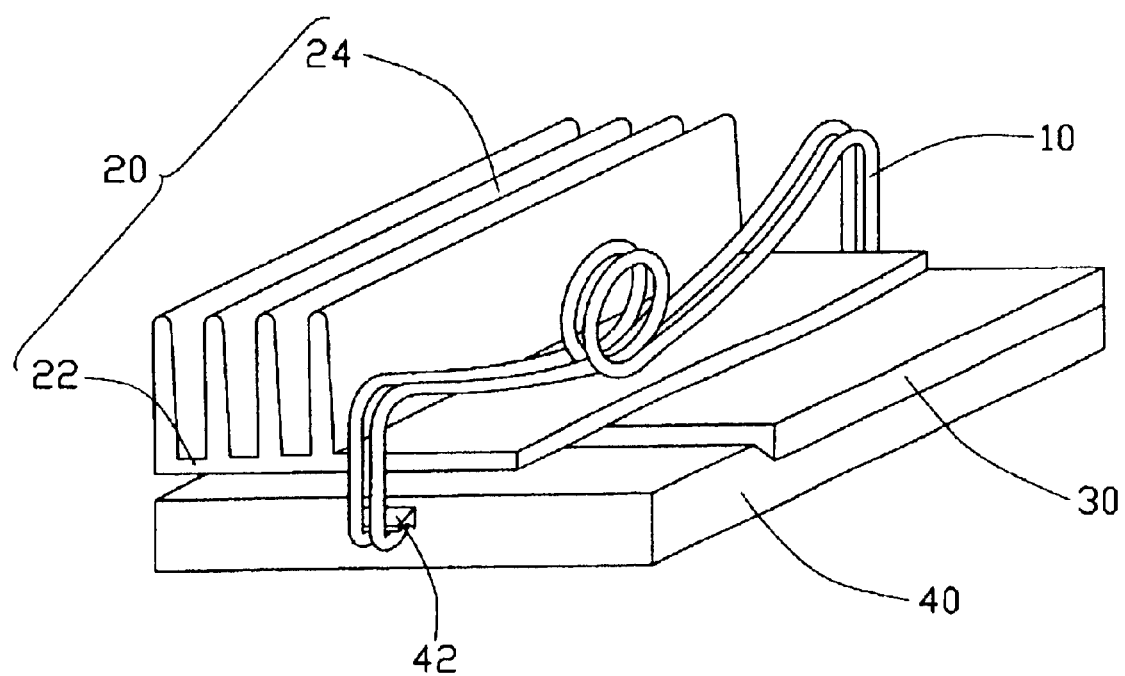
FIG. 2 is an isometric view of the clip of FIG. 1 securing a heat sink to a CPU mounted on a CPU socket, with part of the heat sink cut away for clear illustration.
Figure 3:
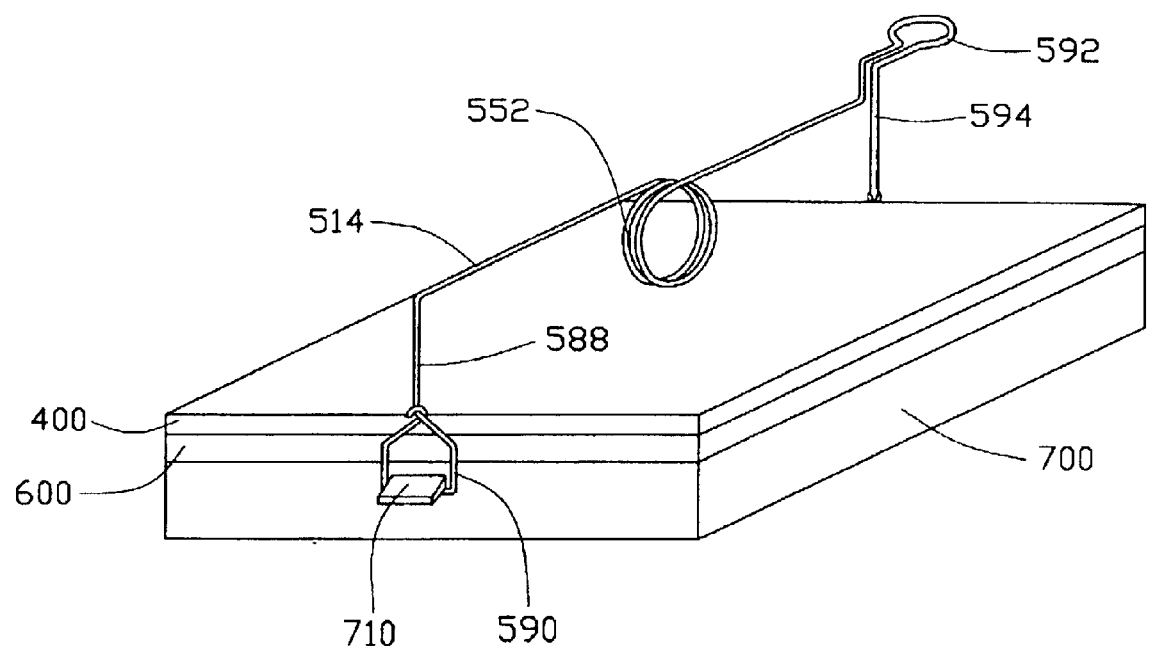
FIG. 3 is a schematic, isometric view of a conventional heat sink clip securing a heat sink to a CPU mounted on a CPU socket.

Referring to FIGS. 1 and 2, a heat sink clip 10 in accordance with a preferred embodiment of the present invention is for securing a heat sink 20 to a CPU 30 mounted on a CPU socket 40. The heat sink 20 comprises a chassis 22, and a plurality of parallel heat sink fins 24 extending upwardly from the chassis 22. A pair of retaining ears 42 is outwardly formed from opposite sides of the CPU socket 40 respectively.

The heat sink clip 10 is shaped from a single piece of metal wire. Opposite ends of the metal wire are bent to form a generally twin strand structure that is the heat sink clip 10. The heat sink clip 10 comprises a central pressing portion 12, a pair of resilient portions 18 extending outwardly and upwardly from opposite sides of the pressing portion 12 respectively, and two arms 14 depending from free ends of the resilient portions 18 respectively. The pressing portion 12 comprises two circular units (not labeled) providing stabilization of the whole clip 10, and two contact points (not labeled) which, in this embodiment, are essentially outside of periphery of the corresponding circular unit, are located around a bottom portion thereof, thus assuring deformation of the circular unit not to effect the contact points. Alternately, such contact points may be a part of the corresponding circular unit under different embodiments, if different shaped resilient portion 18 is equipped therewith. A pair of hooks 16, 16' is inwardly formed from free ends of the arms 14 respectively.

In use, the heat sink 20 is placed on the CPU 30 that is mounted on the CPU socket 40. The heat sink clip 10 is placed between two centermost of the fins 24 of the heat sink 20. The pressing portion 12 of the clip 10 rests on the chassis 22 of the heat sink 20. The resilient portions 18 at the arms 14 are depressed so that the hooks 16, 16' of the arms 14 are snappingly engaged with undersides of the retaining ears 42 of the CPU socket 40. Thus the chassis 22 of the heat sink 20 is resiliently and firmly pressed against the CPU 30 by the pressing portion 12 at the four contact points thereof. The heat sink 20 is securely fastened to the CPU 30 on the CPU socket 40 by the heat sink clip 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip adapted for securing a heat sink to an electronic device, the clip comprising:

a pressing portion adapted for pressing a chassis of the heat sink, the pressing portion comprising two generally parallel circular units;

two resilient portions extending outwardly and upwardly from opposite ends of the pressing portion; and two arms depending from distal ends of the resilient portions respectively, a retaining portion being formed at each of the arms for engaging with a socket;

wherein the clip is shaped from a single wire such that it has a generally twin strand structure.

2. The clip as recited in claim 1, wherein the circular units each have two contact points for pressing the heat sink.

3. The clip as recited in claim 1, wherein the retaining portion is a hook.

4. The clip as recited in claim 1, wherein the clip is made of metallic material.

5. An electronic package assembly comprising:

a socket having a pair of retaining protrusions arranged at opposite sides thereof;

an electronic package mounted on the socket;

a heat sink attached on the electronic package, the heat sink having a chassis and a plurality of fins extending from the chassis; and a clip positioned on the heat sink and securing the heat sink on the electronic package;

wherein the clip is shaped from a single wire such that it has a generally twin strand structure, and the clip comprises a central pressing portion pressing the chassis of the heat sink and comprising two circular units normal to the chassis, two resilient portions extending from the pressing portion, two arms depending from the pressing portions, and two retaining portions formed at the arms and engaging with the protrusions of the socket.

6. The electronic package assembly as recited in claim 5, wherein the resilient portions extend outwardly and upwardly from the pressing portion.

7. The electronic package assembly as recited in claim 5, wherein the circular portions each have two contact points pressing the heat sink.

8. The electronic package assembly as recited in claim 5, wherein the two retaining portions are two hooks.

9. The electronic package assembly as recited in claim 5, wherein the clip is made of metallic material.

10. An electrical assembly comprising:

a retention assembly holding an electronic package thereon;

retention devices provided on the retention assembly;

a heat sink seated upon the electronic package;

a clip made from a spring wire which is easy to be bent, said clip including:

a first set retention section including:

a pressing portion having a circular unit defining at least one complete loop thereof and two contact points downwardly abutting against the heat sink;

a pair of resilient portions extending upwardly and outwardly from the contact points of the pressing portion; and two legs downwardly extending from the corresponding resilient portions with securing devices latched to the corresponding retention devices, respectively.

11. The assembly as recited in claim 10, wherein said two contact points are lowest points of said circular unit.

12. The assembly as recited in claim 10, wherein said clip further includes a second set retention section similar to and integrally formed with the first set retention section.

13. The assembly as recited in claim 12, wherein an joint between said first set retention section and said second set retention section is located around one of said securing devices.

14. The assembly as recited in claim 10, wherein an upper point of the leg is generally located at a same level with an upper point of the corresponding circular unit.

15. The assembly as recited in claim 11, wherein the heat sink comprises a chassis against which said two contact points abut, and the circular unit is normal to the chassis.

* * * * *